United States Patent
Öberg (10) Patent No.: US 7,786,902 B1
(45) Date of Patent: *Aug. 31, 2010

(54) CIRCUITS, ARCHITECTURES, SYSTEMS, METHODS, ALGORITHMS AND SOFTWARE FOR CONDITIONAL MODULATION CODING

(75) Inventor: Mats Öberg, Cupertino, CA (US)

(73) Assignee: Marvell International Ltd., Hamilton (BM)

( * ) Notice: Subject to any disclaimer, the term of this patent is extended or adjusted under 35 U.S.C. 154(b) by 79 days.

This patent is subject to a terminal disclaimer.

(21) Appl. No.: 12/206,673

(22) Filed: Sep. 8, 2008

Related U.S. Application Data (63) Continuation of application No. 11/978,788, filed on Oct. 29, 2007, now Pat. No. 7,425,905, which is a continuation of application No. 10/872,098, filed on Jun. 17, 2004, now Pat. No. 7,301,482.

(60) Provisional application No. 60/529,046, filed on Dec. 12, 2003.

(51) Int. Cl.
*H03M 7/00* (2006.01)

(52) U.S. Cl. .............................. 341/50; 341/51; 341/58

(58) Field of Classification Search .................. 341/50, 341/51, 58, 94; 714/785, 752; 704/228
See application file for complete search history.

(56) References Cited

U.S. PATENT DOCUMENTS

| | | | | |
|---|---|---|---|---|
| 5,283,831 | A | * | 2/1994 | Cook et al. ................. 380/268 |
| 5,351,300 | A | * | 9/1994 | Quisquater et al. ........... 380/46 |
| 6,018,304 | A | | 1/2000 | Bessios |
| 6,557,136 | B1 | | 4/2003 | Friedmann |
| 6,617,985 | B1 | | 9/2003 | Poeppelman |
| 6,823,487 | B1 | | 11/2004 | Poeppelman |
| 6,885,988 | B2 | | 4/2005 | Chen |

* cited by examiner

*Primary Examiner*—Jean B Jeanglaude (57) ABSTRACT

Methods, algorithms, software, circuits, architectures, and systems for conditionally encoding information and processing conditionally encoded information. The present invention takes advantage of codes where most randomly selected data units fulfill the coding constraints. Thus, only those data units that need encoding (i.e., that do not fulfill coding constraints) are encoded, and those data units that do not need encoding (i.e., that fulfill coding constraints) are not encoded. By doing so, one may increase the density, bandwidth and/or gain of data communications, increase the error checking and/or correcting capabilities of a data communications system, and/or reduce interference in a multi-user system.

20 Claims, 4 Drawing Sheets

CIRCUITS, ARCHITECTURES, SYSTEMS, METHODS, ALGORITHMS AND SOFTWARE FOR CONDITIONAL MODULATION CODING

RELATED APPLICATION(S)

This application is a continuation of U.S. patent application Ser. No. 11/978,788, filed Oct. 29, 2007, issued as U.S. Pat. No. 7,425,905 on Sep. 16, 2008, which is a continuation of U.S. patent application Ser. No. 10/872,098, filed Jun. 17, 2004, issued as U.S. Pat. No. 7,301,482 on Nov. 22, 2007, both of which are incorporated herein by reference in their entireties, and claims the benefit of U.S. Provisional Patent Application No. 60/529,046, filed Dec. 12, 2003, which is incorporated herein by reference in its entirety.

FIELD OF THE INVENTION

The present invention generally relates to the field of encoded information transmissions and data communications. More specifically, embodiments of the present invention pertain to circuits, architectures, systems, methods, algorithms and software for data communications using conditional modulation coding.

DISCUSSION OF THE BACKGROUND

Figure 1:
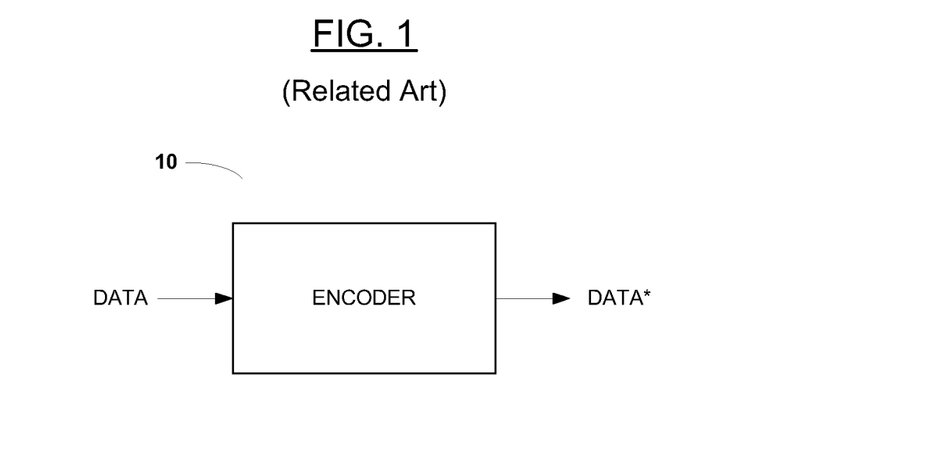
FIG. 1 is a box-level diagram a conventional encoding circuit.

FIG. 1 shows a conventional encoder 10 for coding a high-frequency serial data stream (e.g., DATA). Regardless of the nature of or constraints on the data, DATA is always encoded by encoder 10 to provide encoded data (e.g., DATA*).

Figure 2:
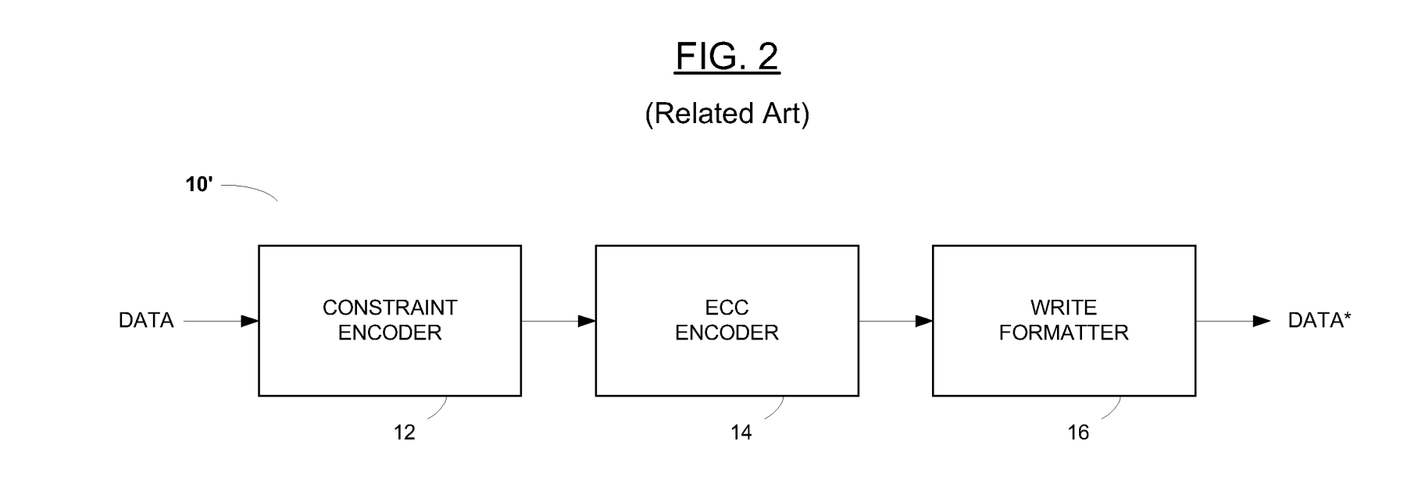
FIG. 2 is a box-level diagram a conventional encoding circuit configured for error checking.

FIG. 2 shows a conventional circuit 10' for encoding a high-frequency serial data stream (e.g., DATA), comprising modulation encoder 12, ECC encoder 14, and write formatter 16. Conventional encoding circuit 10' provides a conventional error checking and/or control (ECC) function for the data transmission. Encoding circuit 10' also formats the encoded data for writing into a recording medium (e.g., a magnetic disk). Regardless of the nature of or constraints on the data, DATA is always encoded by circuit 10' to provide encoded data (e.g., DATA*).

State of the art modulation codes for magnetic recording are very high rate codes with relatively loose constraints. For example, a run length limited (RLL) code constraint of (O,G/I)=(0,20/18) means at most 20 consecutive zeros, and at most 18 consecutive zeros in either the even or the odd interleave, respectively. For a randomly selected data sequence of 4000 identically and independently distributed bits where the probability of selecting a one is equal to the probability of selecting a zero, the probability that the RLL constraint is violated is about 1%, meaning that about 1 in 100 such sequences violates the constraint.

While random code may comply with some constraints the vast majority of the time, the probability that a randomly selected sequence violates a constraint can be very different for different constraints. For example, certain RLL code words may consist of a number of uncoded bytes and a number of encoded bytes, using an x/y code (where y=x+the number of encoding and/or parity bits). Constraints that may be imposed by this code include (i) at least 5 transitions for each code word and (ii) at least 1 transition in each interleave (e.g., in an even/odd interleave system, each of the 2 interleaves must have at least 1 transition therein). Since most randomly selected data words fulfill these two constraints without any coding (in the case described above, about 99% of the data words fulfilled the constraints), it could be beneficial and/or advantageous to devise a new type of coding where only those code words that need encoding (i.e., that do not fulfill coding constraints) are encoded, and those code words that do not need encoding (i.e., that fulfill coding constraints without being encoded) are not encoded.

SUMMARY OF THE INVENTION

Embodiments of the present invention relate to circuitry, architectures, systems and methods for conditional modulation coding. Assuming that the constraint(s) that are imposed are loose enough so that a significant number of uncoded sectors do not violate the constraint, the invention focuses on a scheme to not encode those information units (e.g., code words, data sectors) that do not violate any of the constraints, and instead only encode those units that need to be encoded. For convenience, this scheme may be denoted and/or referred to herein as conditionally encoded information, and with regard to certain preferred embodiments as conditional modulation coding.

The idea behind conditionally encoded information is simple: check if incoming data fulfills one or more desired constraints, and if it does write the data as is (uncoded) with some indicator bits (which may be spread over the word, block or sector, or inserted as a prefix or suffix) indicating that the data is uncoded. If the constraints are not fulfilled, encode the data and write the coded data with some indicator bits indicating that the data is encoded. By writing equally long data blocks or sectors, encoded blocks or sectors will have coding bits and unencoded blocks or sectors will not, and the difference in length between encoded and uncoded blocks/sectors can be used for extra error correction capability.

The method of conditionally encoding information according to the invention generally comprises the steps of (a) determining whether the information complies with one or more coding constraints on the information; (b) transmitting encoded information if the information does not fulfill the constraint(s); and (c) transmitting unencoded information if the information fulfills the constraint(s). Although there are a variety of methods for the receiver to identify encoded data (e.g., relative to unencoded data), the method of processing conditionally encoded information generally comprises (i) receiving the conditionally encoded information, (ii) determining whether the conditionally encoded information is unencoded or encoded; and (iii) decoding at least the encoded information. The algorithms and/or software generally implement one or more aspects of the method(s) described herein.

The circuitry and/or hardware architecture for conditionally encoding information according to the invention generally comprises (a) logic configured to determine whether the information to be transmitted complies with one or more constraints; (b) an encoder configured to encode the information; and (c) a selector configured to output (i) the information (unencoded) if it complies with the constraint(s) and (ii) the encoded information if the information does not comply with the constraint(s). The circuitry and/or hardware architecture for receiving and/or processing conditionally encoded information generally comprises (1) a decoder configured to decode the conditionally encoded information; (2) a detector configured to determine a value of an indicator associated with the conditionally encoded information; and (3) a first selector configured to output (i) unencoded and/or undecoded information if the indicator has a first value and (ii) decoded information if the indicator has a second value. The systems generally comprise those that include a circuit embodying one or more of the inventive concepts disclosed herein.

The present invention advantageously increases the density, bandwidth and/or gain of data communications, increases the error checking and/or correcting capabilities of a data communications system, and/or reduces interference in a multi-user system. These and other advantages of the present invention will become readily apparent from the detailed description of preferred embodiments below.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on data bits, data streams or waveforms within a computer, processor, controller and/or memory. These descriptions and representations are generally used by those skilled in the data processing arts to effectively convey the substance of their work to others skilled in the art. A process, procedure, logic block, function, operation, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like.

It should be borne in mind, however, that all of these and similar terms are associated with the appropriate physical quantities and are merely convenient labels applied to these quantities. Unless specifically stated otherwise and/or as is apparent from the following discussions, it is appreciated that throughout the present application, discussions utilizing terms such as "processing," "operating," "computing," "calculating," "determining," "manipulating," "transforming," "displaying" or the like, refer to the action and processes of a computer, data processing system, logic circuit or similar processing device (e.g., an electrical, optical, or quantum computing or processing device), that manipulates and transforms data represented as physical (e.g., electronic) quantities. The terms refer to actions, operations and/or processes of the processing devices that manipulate or transform physical quantities within the component(s) of a system or architecture (e.g., registers, memories, other such information storage, transmission or display devices, etc.) into other data similarly represented as physical quantities within other components of the same or a different system or architecture.

Furthermore, for the sake of convenience and simplicity, the terms "clock," "time," "rate," "period" and "frequency" are generally used interchangeably herein, but are generally given their art-recognized meanings. Also, for convenience and simplicity, the terms "data," "data stream," "waveform" and "information" may be used interchangeably, as may the terms "connected to," "coupled with," "coupled to," and "in communication with" (which may further involve a direct or indirect relationship between the connected, coupled and/or communicating items), and the terms "(un)coded" and "(un)encoded" (and grammatical variations thereof), but these terms are also generally given their art-recognized meanings.

As used herein, unless the context clearly and unambiguously indicates otherwise, the term "block" generally refers to a word, sequence, sector, frame, packet or other unit of information (e.g., data) having a known, predictable or calculable length. Also, the terms "bit," "byte," "symbol" and "word" generally have their art-recognized meanings, but as used herein, a "byte" is generally a group of bits having a known integer group size (e.g., 8 to 10 bits), and a "word" is generally a group of bytes having a known integer group size (e.g., 3 to 5 bytes). In addition, with regard to error control and/or correction, the terms "capability" and "capacity" are interchangeable, and generally refer to the maximum number of errors that a particular error checking and/or correction scheme can detect and/or correct.

The present invention concerns methods for generating and processing conditionally encoded information. In an aspect directed towards conditionally encoding information, the method generally comprises (a) determining whether the information complies with one or more constraints on the information; (b) transmitting encoded information if the information does not fulfill the constraint(s); and (c) transmitting the information if the information fulfills the constraint(s). In another aspect directed towards processing conditionally encoded information, the method generally comprises (i) receiving the conditionally encoded information, (ii) determining whether the conditionally encoded information is unencoded or encoded; and (iii) decoding at least the encoded information.

Even further aspects of the invention concern a circuit, architecture and system for conditional (modulation) coding. The coding circuit generally comprises (a) logic configured to determine whether information complies with one or more constraints; (b) an encoder configured to encode the information; and (c) a selector configured to output (i) the information if the information complies with the constraint(s) and (ii) the encoded information if the information does not comply with the constraint(s).

There are several embodiments, implementations and/or advantageous uses for which the invention can be utilized (e.g., reducing the average density in storage systems, increasing the error control and/or correction code redundancy, increasing number of information bits per data block [e.g., frame or sector] that is transmitted/written, or transmitting shorter blocks or frames to increase bandwidth or reduce interference for other users in a multi-user system). The invention, in its various aspects and/or different embodiments, will be explained in greater detail below with regard to exemplary embodiments.

Exemplary Methods of Conditional Modulation Coding

The present invention relates to method of conditionally encoding information, generally comprising the steps of (a) determining whether the information complies with one or more constraints on the information; (b) transmitting encoded information if the information does not fulfill the one or more constraints; and (c) transmitting the information if the information fulfills the one or more constraints. Generally, in practice, the step of transmitting the encoded information comprises selecting the encoded information for output on a bus in response to an indication that the information does not fulfill the one or more constraints, and the step of transmitting the information comprises selecting the information for output on the bus in response to an indication that the information fulfills the one or more constraints. In one important application (e.g., data communications with conventional storage devices and/or recording media), the information further comprises error control and/or correction code.

The phrase "conditionally encoded information" generally refers to information that may be unencoded or encoded, as the case may be, depending on whether the uncoded information complies with or fulfills certain code constraints. "Information" may comprise data, audio (voice) and/or video information, may comprise analog and/or digital information, and may be embodied in signals characterizable as single- or multi-bit, serial or parallel, and/or single-ended or differential. In one embodiment, the information comprises data, and in various implementations, the block of information comprises a data sector, data packet or a frame comprising data. However, for convenience and simplicity, the terms "data" and "information" will be used interchangeably herein.

In most cases, the information must fulfill or comply with a plurality of constraints. In the examples discussed below, certain codes may require a certain minimum number of transitions per unit of data (e.g., at least p transitions per word, where p is at least 2, 3, 4 or 5), at least one transition for each of q interleaves (where q may be from 2 to 20, 2 to 15, or 2 to 12, and an "interleave" is the block, section, or other unit of data that results from interleaving the individual bits, bytes or other subunits of serially transmitted information), or a certain maximum number of consecutive bits having the same binary state or value (e.g., no more than r consecutive zeros, where r is at least 10, 12, 15 or 18). Of course, the constraints may include plural constraints of the same type (e.g., no more than r consecutive "same state" bits in a first location or index and no more than r' consecutive "same state" bits in a second location or index, where r is as defined above and r' is independently at least 12, 15, 18 or 20, for example). Thus, the constraints may, for example, comprise one or more minimum transitions per unit of information, a minimum number of transitions per interleave (e.g., a minimum number of transitions [for example, 1 transition] in each unit of interleaved data in a set of such interleaved data units), and/or one or more maximum numbers of consecutive bits having the same state.

The present invention enjoys particular advantage when used for modulation encoding. Thus, in the present method, data may comprises a run length limited (RLL) code. Alternatively or additionally, when encoded, the encoded information may comprise an x/y rate code, where x<y and x and y are each independently an integer of at least 2, 8 or 10. Some conventional codes include 8/10 codes, 10/11 codes and 64/66 codes. In one implementation, the code is a 30/31 code.

Generally, the method further comprises the step of encoding at least the information that does not fulfill the constraint(s). In one embodiment, all of the information is encoded, and the method further comprises selecting (e.g., for subsequent transmission) either (i) the encoded information if the information does not comply with the constraint(s) or (ii) the unencoded information if it complies the constraint(s). Encoding preferably comprises modulation encoding, and may further include error correction and/or control (ECC) encoding (although, in some embodiments, ECC encoding may be more appropriately considered to be a form of error checking). However, the conditional coding scheme(s) described herein are not necessarily limited to modulation codes, and may be applied to other information signal-shaping codes as well, such as line codes and data translation codes. Furthermore, ECC techniques are not necessarily limited to ECC encoding, and may encompass any conventional technique for error checking, correction and/or control, such as cyclic redundancy checking.

As will be discussed in greater detail below (particularly for those embodiments without ECC), the method may further comprise the step of indicating whether the (unencoded) information or the encoded information is transmitted. The step of indicating may comprise adding one or more indicator bits to at least one of, and preferably both of, the (unencoded) information and the encoded information. To improve reliability, the indicator may comprise a plurality of indicator bits, the indicator bits having a first state or value for indicating (unencoded) information and a second state or value for indicating encoded information. Spreading the indicator out over the entire unit of information further improves reliability of the indicator. Thus, in certain embodiments, the indicator comprises a first plurality of indicator bits at a first location in conditionally encoded information, and a second plurality of indicator bits at a second location in the information or the encoded information.

The method may further comprise the step of writing the conditionally encoded information (i.e., either the [unencoded] information or the encoded information) after the transmitting step(s). In a preferred embodiment, the conditionally encoded information is written to or from a storage or recording medium, more preferably a magnetic recording medium.

In a further embodiment, the method of conditionally encoding information further comprises the step of adding error control and/or correction code to the conditionally encoded information. As will be discussed below, in one implementation, the method further comprises increasing the error control and/or correction code by up to n-k information units, where the (unencoded) information has a length of k units and the encoded information has a length of n units. As mentioned above, a unit of information may take the form of a sector, word, byte, block or other unit of data.

In one embodiment directed towards either increasing the bit density of the transmission or improving the detection reliability of transmitted information, the method further comprises the step of writing the same length of each block of conditionally encoded information, whether encoded or not. Typically, writing conditionally encoded information occurs after the transmitting step(s). In one implementation (e.g., as discussed below), the method further comprises the steps of (i) writing k units of the conditionally encoded information, whether or not the information is encoded, and (ii) decoding the k units of conditionally encoded information. While decoding conditionally encoded information is generally part of the present method of processing conditionally encoded information, the present method may, in certain implementations (discussed in greater detail below), further comprise the steps of (1) adding n-k erasure units to the k units of the information or the encoded information if the decoding step fails to decode the information or the encoded information, and (2) decoding the k units of the information or the encoded information and the n-k erasure units.

Figure 3:
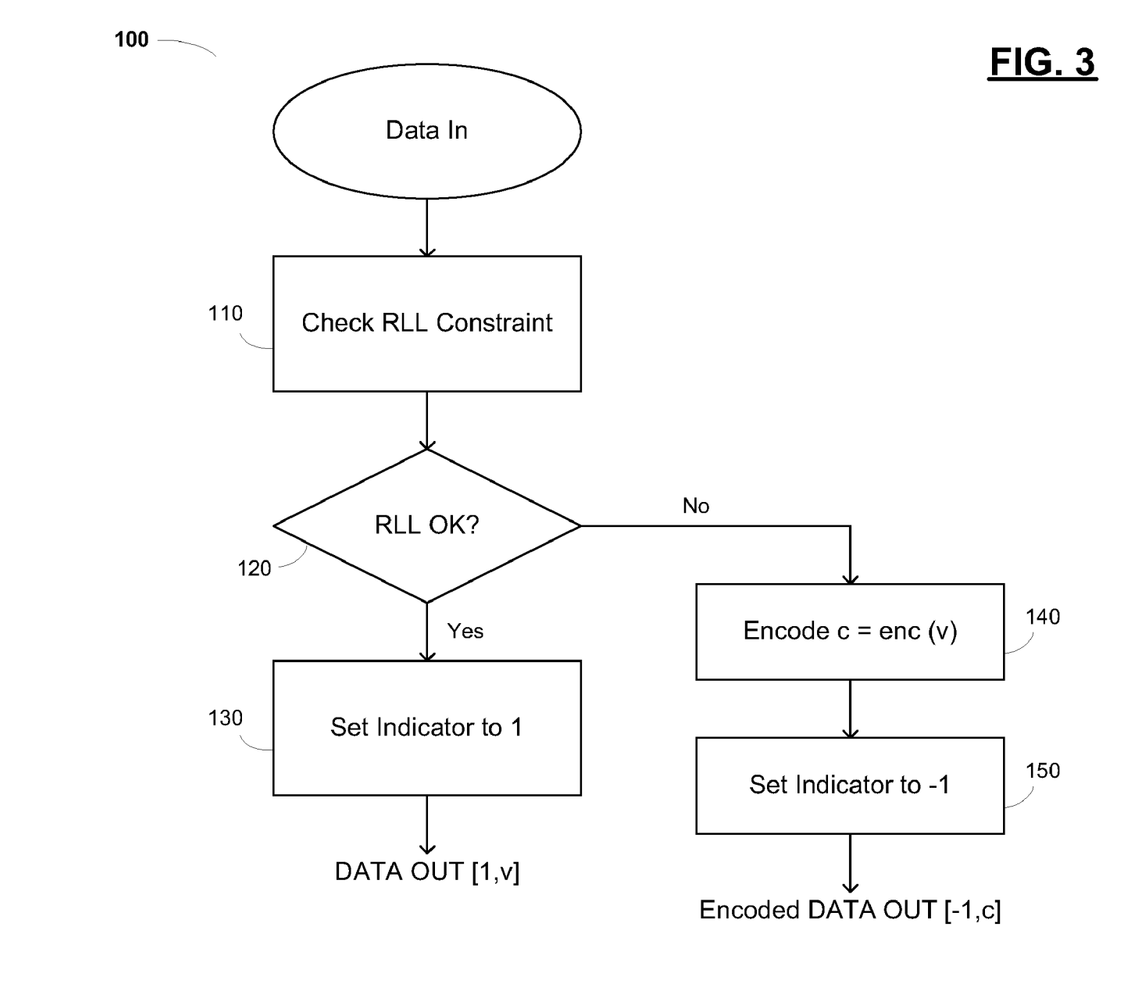
FIG. 3 is a flow diagram showing an exemplary algorithm for the present method and/or software.

A block diagram describing an exemplary algorithm and/or method 100 for conditional modulation encoding in accordance with the present invention is shown in FIG. 3. Assume that a sequence of symbols transmitted over a channel ("Data In") must fulfill a modulation constraint (e.g., a RLL constraint or a maximum transition run [MTR] constraint). Assume further that we have a modulation code for which the output sequence fulfills the modulation constraint. Then, instead of blindly encoding every input sequence as in FIGS. 1-2 (and transmitting only encoded data), the input sequence DATA IN is transmitted in encoded form only if the sequence does not fulfill the predetermined and/or desired modulation constraints.

First, in step 110, the input sequence DATA IN is checked to see if it complies with or fulfills RLL modulation constraints. If so, at decision box 120, the uncoded input sequence DATA IN is considered a valid RLL sequence, and an indicator in the data stream is set at step 130. If the input sequence DATA IN does not fulfill all of the RLL modulation constraints, the input sequence DATA IN is encoded (e.g., by a conventional RLL modulation encoder) in step 140 to ensure that the input sequence DATA IN fulfills the RLL modulation constraints. In FIG. 3, the input sequence DATA IN may be represented by the symbol v, and the encoded sequence corresponding to DATA IN may be represented by the symbol c. The encoded sequence c has a length greater than that of the input sequence v. In step 150, as in step 130, an indicator for the encoded data is set (generally, to a different value or state than the corresponding indicator for uncoded data).

In one embodiment, the indicator has a first binary state (e.g., 1) for indicating uncoded data and a second binary state (e.g., 0 or −1) for indicating encoded data. Thus, in FIG. 3, DATA OUT may be represented by [1,v] and encoded DATA OUT may be represented by [−1,c]. In an alternative embodiment, the indicator comprises a plurality of bits each having a first binary state for indicating uncoded data and a second binary state for indicating encoded data. Thus, in FIG. 3, DATA OUT may be represented by [1, . . . 1,v] and encoded DATA OUT may be represented by [−1, . . . −1,c]. In one implementation, the indicator is 20 bits long. In a further embodiment, the indicator may be split into a plurality of groups (e.g., 4) and spread out over the data block. Thus, in FIG. 3, DATA OUT may be alternatively represented by $[1,1,1,1,1, v_0, v_1, \ldots v_{k/4}, 1,1,1,1,1, v_{k/4+}, v_{k/4+2}, \ldots v_{k/2}, 1,1,1,1,1, v_{k/2+1}, v_{k/2+2}, \ldots v_{3k/4}, 1,1,1,1,1, v_{3k/4+1}, v_{3k/4+2}, \ldots v_k]$ and encoded DATA OUT may be represented by $[-1,-1,-1,-1,-1, c_0, c_1, \ldots c_{k/4},-1,-1,-1,-1,-1, c_{k/4+1}, c_{k/4+2}, \ldots c_{k/2},-1,-1,-1,-1,-1, c_{k/2+1}, c_{k/2+2}, \ldots c_{3k/4},-1,-1,-1,-1,-1, c_{3k/4+1}, c_{3k/4+2}, \ldots c_n]$, where k corresponds to the length of the uncoded data block and n corresponds to the length of the encoded data block. However, in general, any patterns may be used as respective indicators of encoded and unencoded data, as long as the probability of mistaking one indicator for the other is sufficiently small, given the likelihood of bit errors in the location(s) corresponding to the indicator.

There are many advantages to conditional coding. If one assumes, for example, that a sector of uncoded data has 140 code words, that 20 indicator bits are used to indicate if a sector is encoded or not, that 1 extra bit is added to each encoded code word, and that 90% of the code words fulfill the predetermined constraint(s), then on average one has (20+(140/10))=34 extra bits per sector in the conditional coding scheme. On the other hand, if every data sector was encoded, one would have 140 extra bits in the sector. Thus, in this example, assuming a code word length of 30 bits, the present invention provides average reductions of (i) about ((140-34)/30)≈3.5 words/sector (corresponding to an increase of≈2.5% in density), and (ii) about 4x (i.e., 140/34) in the number of encoding bits added to the data sector.

Also, 20 indicator bits (which may be inserted as a prefix or spread over the sector) are sufficient to indicate if a sector is coded or not. Even if the indicator bits are not decoded properly, one may simply assume that the data was not coded, and if that does not work out (e.g., the information cannot be further processed at some point downstream of the receiver because the information does not fulfill the predetermined constraint[s]), one can then assume that the data is encoded. The gain for this example is about 0.5 dB in a conventional magnetic medium read channel device, including the improved channel bit density.

An Exemplary Implementation of Conditionally Encoded Information with Improved Bit Density and Error Checking and/or Control As described above, the present invention can also be utilized to increase ECC (error correction) capability. Typically, magnetic recording systems use a Reed-Solomon ("R-S") error control code (ECC) to correct read errors. An (N,K) R-S code has P parity bytes (where P=N−K) and can correct up to (i) t byte errors or (ii) $t_e$ errors and s erasures, where:

$$t = \left[\frac{N+K}{2}\right] \quad (1)$$

and $$2t_e + s \leq N-K \quad (2)$$

One may assume that the length of a data sector is k bytes and that a conventional system which encodes every sector uses an (n,k) modulation code. While any of a variety of modulation codes may be used in practice, for this example, the modulation code shall be treated as a block code spanning a whole sector. In the conventional system, if an R-S code with P parity bytes is used, then the k data bytes are encoded to n bytes by the modulation encoder, and subsequent ECC encoding yields N ECC encoded bytes, where N=n+P, and t byte error correction capability, where t=P/2.

Using the present invention, the error correction capability may be increased for those sectors that, without encoding, fulfill the modulation constraint(s). Because one may avoid modulation encoding in uncoded sectors, one may insert (n-k)

extra ECC and/or parity bytes in uncoded sectors. For those sectors, the byte error correction capability can be increased to $t_u$, where:

$$t_u = \left\lceil \frac{P+n-k}{2} \right\rceil \quad (3)$$

For the sectors that have to be encoded, one can either keep an ECC with P parity bytes, or modify the ECC slightly. If one keeps the ECC with P parity bytes, then one may use different ECC codes for the encoded and the unencoded cases. If one uses different ECC codes, the receiver preferably is configured to determine whether the data is encoded or unencoded. This can be handled by inserting an indicator (e.g., a conventional flag or set of bits having a known or predetermined location in the block of information) into the data sector sequence, and then using this indicator to select which ECC to use, depending on the coding state of the data (i.e., whether it is encoded or unencoded). Since an error in the indicator bit(s) could select the wrong ECC decoder, this is not an advantageous method for embodiments in which there is only a single indicator bit (i.e., in this example, there are preferably a plurality of indicator bits [e.g., several such bits]), but then the code rate may become disadvantageously low. However, in some applications, a relatively low code rate may not be prohibitively disadvantageous.

Alternatively, one may modify the ECC encoding to increase the error correcting capability. In this embodiment, one may use up to P+n-k parity bytes, and one can use the same ECC for both encoded and unencoded sequences. Thus, to analogize to the conventional system described above, one may use an (n+P+n-k,n) R-S code, with error correction capability $t_u$ as described in equation (3) above, where the subscript u indicates that the correction capability is valid for unencoded sequences.

In the case where the k input bytes are not encoded, one pads the input sequence with n-k zero bytes prior to ECC encoding. Thereafter, only the k uncoded input bytes and the P+n-k parity bytes are written into the formatter (although the separate parity bytes might need to be encoded by a modulation encoder in certain applications).

If, instead, the k input bytes are encoded by the modulation encoder, then the n encoded bytes are encoded by the ECC encoder, but only the first k bytes of the n encoded bytes are written together with the P+n-k parity bytes. Assuming that a majority of input sequences do not need to be encoded, the receiver may pad the k received bytes that are not parity bytes with n-k zero bytes, and then try to decode the sequence with parity. Methods for decoding such information are discussed in detail below.

Exemplary Methods of Processing Conditionally Encoded Information

A further aspect of the present invention relates to a method of processing conditionally encoded information, comprising the steps of: (a) receiving the conditionally encoded information, where the conditionally encoded information is unencoded if the unencoded information fulfills one or more constraints (e.g., associated with an applicable code) and is encoded if the unencoded information does not fulfill the constraint(s); (b) determining whether the conditionally encoded information is unencoded or encoded; and (c) decoding at least the encoded information. There are a limited number of possible outcomes for any effort to decode conditionally encoded information (i.e., regardless of whether the information is encoded or not). Decoding either succeeds or not, and if it does, the indicator indicates either encoded or unencoded data. As a consequence, techniques for processing conditionally encoded information are somewhat surprisingly straight-forward.

In one embodiment, the step of determining comprises identifying an indicator configured to indicate an encoding status, the indicator having a first state or value for unencoded information and a second state or value for encoded information. The indicators and their corresponding states/values are generally as described above, and techniques for such determinations are known to those skilled in the art. For example, one may compare the indicator with a known and/or predetermined value, and/or one may perform a logic function (such as an OR or NAND function), to detect the indicator and/or determine whether the indicator has a known value (such as all zeros or all ones). The method may further comprise removing the indicator from the information once its state and/or value have been determined.

In one implementation, all received information is decoded, and the method further comprises selecting one of the decoded information and undecoded information (e.g., as received from the channel) as an output for further processing. The outcome of the indicator determining step determines whether decoded information or undecoded information is selected (e.g., if the indicator has a value correlated to or indicating encoded information, then decoded information is selected and/or if the indicator has a value correlated to or indicating unencoded information, then undecoded information is selected).

As for the method of conditionally encoding information, the step of decoding may comprise modulation decoding the unencoded information or the encoded information, although line decoding and/or data translation decoding are suitable alternatives. In certain embodiments, each of the unencoded information and the encoded information may further comprise error correction and/or control (ECC) code, and the step of decoding further comprises ECC decoding the unencoded information or the encoded information.

An Exemplary Implementation of Processing Conditionally Encoded Information With Improved Bit Density and ECC There are three possible outcomes of any effort to decode information conditionally encoded in accordance with the above exemplary implementation, whether applied to encoded or unencoded data: (a) the decoder successfully decodes the sequence, and the zero bytes that were added remain zero; (b) the decoder successfully decodes the sequence, and the bytes that were added (either the zero bytes or the n-k encoding bytes) are changed; and (c) the decoder fails to decode the sequence. Case (a) means that either the input sequence was not encoded by the modulation encoder, or the ECC decoder has decoded to an erroneous sequence. Case (b) means that the input sequence was encoded by the modulation encoder, or the ECC decoder has decoded to an erroneous sequence. Case (c) means that there are too many byte errors in the received sequence (i.e., there are more than $t_u$ errors if the input sequence is not encoded, or more than $t_u$-(n-k) errors if the input sequence is encoded). If case (c) is the result, then one can change the padded zeros to erasure bytes (e.g., composed of bits representative of an "I don't know" logic state), and try to decode again. One can decode correctly in the case where the input sequence is encoded and there is at most $t_u$-((n-k)/2) byte errors in the received sequence.

When comparing this embodiment to the conventional system that always encodes the input sequence (having an error correction capability of at most P/2 byte errors), the present invention provides an error correction capability of $((P+n-k)/2)$ for unencoded sequences (which, in this case, represent most input sequences), and $((P+n-k-(n-k))/2)=P/2$ for the remaining (encoded) sequences. In the above examples, the description has focused on use of R-S ECC codes. However, the invention can be used with any code having an error control and/or correction function, such as Bose-Chaudhuri-Hocquenghem (BCH) codes, Hamming codes, cyclic Hamming codes, Golay code, cyclic Golay code, or Hadamard code. The method can also be used without any error control coding.

Where the information comprises error correction and/or control code, the processing method generally further comprises checking the information (whether encoded or unencoded) for errors. In one embodiment, error checking comprises error correction and/or control (ECC) decoding the information (either or both of the unencoded information or the encoded information, whichever is received and/or processed). Alternatively, error checking may comprise another conventional technique, such as calculating a cyclic redundancy code (CRC) and determining whether the CRC calculated for the received information matches a transmitted CRC (i.e., a CRC that was sent with the received information), in which case zero padding (as discussed herein) may comprise adding a zero pad vector as a prefix to the information to be error-checked. One typically calculates a CRC on information to be transmitted, and adds the CRC to that information, prior to transmission of the information.

As will be explained in greater detail below with regard to the present circuitry, the present method may further comprise, after receiving the information, the step(s) of zero padding and/or erasure padding the information (regardless of whether it is unencoded or encoded), typically with a zero pad vector and/or an erasure pad vector, respectively, to create zero padded and/or erasure padded information, respectively. In these processing embodiments, zero padding and/or erasure padding is used to determine whether the information is encoded or uncoded. In particular, zero padding can function as a kind of post-transmission indicator of encoding status for the information. Also, erasure padding helps to process encoded information properly and/or more accurately when steps have been taken in the conditional coding method to improve bit density and/or write all conditionally encoded information blocks so that they have the same length.

Generally, the step(s) of zero padding and/or erasure padding are performed before information decoding (e.g., modulation decoding), and generally only in combination with ECC decoding (in which case, zero padding and/or erasure padding are also performed before ECC decoding). After the information is ECC decoded, the method may further comprise: (i) determining whether a zero pad vector remains in the zero padded information; (ii) removing the zero pad vector to generate error-checked information; and/or (iii) selecting one of the error-checked information or the decoded, zero padded information as an output for further processing. Thus, in one embodiment, the method comprises the steps of zero padding the information, error checking or ECC decoding the zero padded information, determining whether a zero pad vector remains in the zero padded information, and outputting (1) the error-checked information (which may or may not be zero padded) if the zero pad vector is in the zero padded information or (2) the zero padded, decoded information (e.g., modulation decoded information) if the zero pad vector is not in the zero padded information. When the error-checked information is selected for output, the method preferably further comprises removing the zero pad vector from the zero padded, error-checked information.

Figure 7:
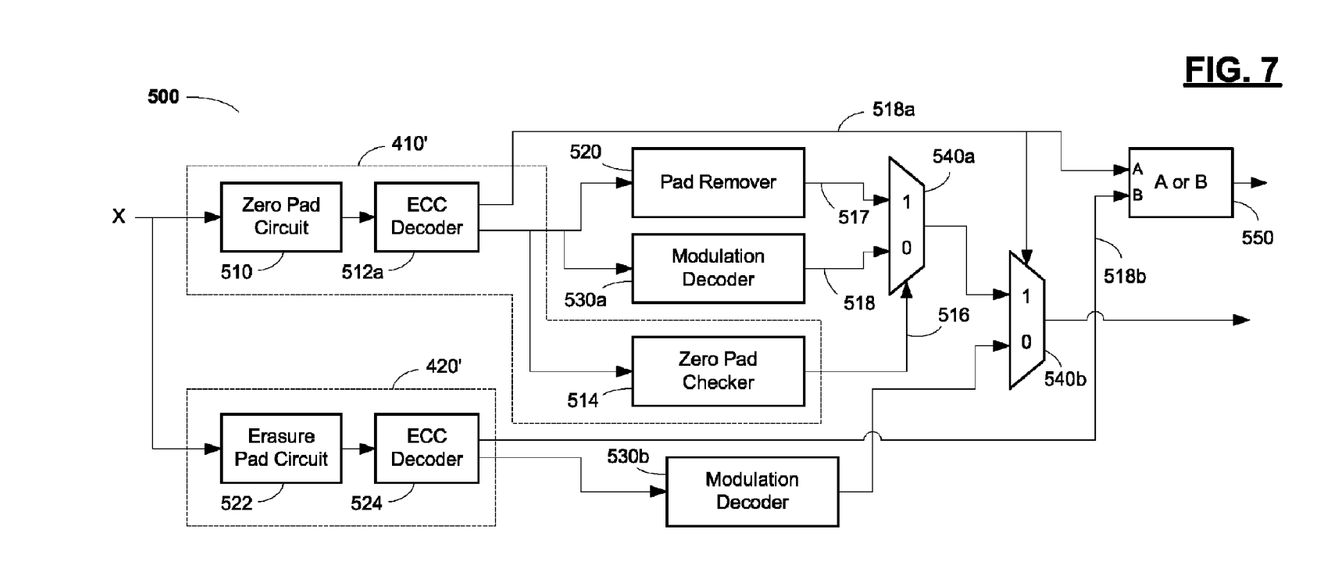
FIG. 7 is a box-level diagram showing an exemplary receiver for processing conditionally encoded information, further configured for error checking.

When error checking is successful, this means that the number of errors in the received information (whether encoded or unencoded) is smaller than the maximum error limit of the ECC decoder (i.e., the ECC decoder's error correction capability). When the zero pad vector is identified or found by pad checker 514, this means the received information is unencoded, in which case the zero pad vector is removed and the unencoded information is selected as the output. If the zero pad vector is not found, this means the received information is encoded, in which case the information is decoded and the decoded information is selected as the output.

If error checking is unsuccessful (e.g., ECC decoding of the received information fails), this typically means that the received information is encoded and that it contains one or more errors. In this case, error checking zero-padded information will generally fail, because the encoded information (i.e., prior to transmission) usually does not contain a series of all zero bits identical to the zero pad vector. In the case where truncated, encoded information is sent and it contains one or more errors, the method generally further comprises erasure padding the received information, generally prior to error checking. Erasure padding essentially instructs the error checking logic to ignore that information that was truncated from the encoded information prior to transmission, thus enabling successful error checking in most cases (see the improved density with ECC implementation discussions above and below).

Thus, where erasure padding is performed in parallel with zero padding (see the discussion of FIG. 7 below), the method may further comprise selecting one of (i) the error-checked (or error-corrected), erasure-padded information or (ii) the output from the "zero pad checking" selection step above as the output for further processing. In the context of this aspect of the invention, error-corrected information comprises error-checked information for which some or all of the errors have also been corrected. ECC decoding, for example, provides error-corrected information, whereas calculating a CRC on a given information block provides error-checked information. However, in this aspect of the invention, the term "error-checked" is generally interchangeable with "error-corrected" and "ECC decoded." If error checking zero-padded information fails, but error checking erasure-padded information succeeds, the error-checked, erasure-padded information is selected as the output for further processing. If error checking zero-padded information succeeds, but error checking erasure-padded information succeeds, either the error-checked (and presumably undecoded) information or the decoded, zero padded information is selected as the output for further processing, depending on whether a zero pad vector was found in the above steps.

In this embodiment, one may improve detection reliability by using a lower density. For input sequences that are not encoded (i.e., that fulfill modulation constraints), one may lower the density by padding the input sequence with n-k zero bytes prior to ECC encoding (e.g., using the same encoder as in the conventional system). Thereafter, only the input sequence plus the ECC parity bytes are written. In this case, the channel bit density is reduced when writing, so that the final written sector size is the same as for those sectors that are encoded by the modulation encoder. In this embodiment, the gain comes from more reliable detection at lower channel bit densities.

In an even further alternative, one may increase the average amount of information in each block (e.g., frame or sector). For a given transmission frame size, it is possible to increase the number of input data bits or bytes, in the case where the data fulfill modulation constraints (i.e., it does not need to be encoded). In those cases, one or more indicator bits can be used to indicate to the receiver whether the data is encoded or unencoded.

In a further alternative, one may write or transmit shorter blocks (e.g., frames or sectors). If the transmission frame size is flexible, the unencoded frames can be shorter than the encoded frames, thus saving bandwidth. For magnetic recording systems, this may not be particularly advantageous, since sector sizes must be constant if one wishes to have the capability to overwrite any sector with any other sector. In such a case, one may not be able to overwrite an unencoded sector with a longer, encoded sector without writing into the next sector.

An Exemplary Gain Calculation for the Present Method

The potential gains from the present method can be computed, and an example of such a gain computation and/or calculation is given hereunder. First, the following constraints for the sectors written on a magnetic disk are defined: (1) For any set of k consecutive symbols, there should be at least t transitions; and (2) for any set of m interleaved symbols, there should be at least s transitions. As described above, the present method encodes only those input sectors that do not fulfill the constraints. Therefore, one must determine the probability that a sector is to be encoded. This probability can be approximated fairly accurately by generating a large number of random sectors (in this example, in the INRZI domain) and checking each sector if the constraint is fulfilled or not. It is then straightforward to compute the fraction of uncoded sectors that do not fulfill the constraints.

For example, let the constraints be for any set of k=30 bits, there are at least t=5 transitions, and for any set of m=15 consecutive interleaved bits, there is at least s=1 transition. For a set of 10,000 random sectors of 4,300 bits each, each sector is checked for constraint violations, and the total number of sectors that violate any constraint are counted. For this experiment, 935 sectors violated at least one of the constraints, so about 1 in 10 sectors will be encoded.

In another example, the set of interleaved bits is increased to m=16. Out of a set of 10,000 random sectors of 4,300 bits each, 639 sectors violate at least one of the constraints, or about 1 out of 15 sectors should be encoded. Similar experiments can be done for other constraints, or alternatively, pure analytical methods can be used to compute the probability that a sector needs to be encoded.

As discussed above, one object of certain embodiments of the present method is to increase the gain in signal transmissions through a channel. The specific gain depends upon the constraints and upon the code rate of the code to be used. In this experiment, the same constraints in the first example above (i.e., k=30, t=5, m=15, and s=1) are assumed for a rate 30/31 RLL code with an uncoded block length of N=4290 bits. The code rate is 30/31=0.9677 if all sectors are encoded. However, if only 1 in 10 sectors are encoded (e.g., in accordance with the first example above), and 20 indicator symbols are used for each sector to indicate its coding state (i.e., whether it is encoded or unencoded), then the average overhead per sector is 20+0.1(4290/30)=34.3 bits, for an average code rate of 4290/(4290+34.3)=0.9921. This amounts to a gain of about 0.1 dB in signal to noise ratio (SNR), and some additional gain in channel bit density for a total gain of almost 0.5 dB.

The gain from this proposed method comes from increasing the effective code rate closer to capacity for the constraint. Greater gains can be realized where the constraints are looser or smaller in number, or where one uses fewer indicator bits for indicating the coding status of the information.

Potential Issues for Consideration

There may be several issues with implementing the present invention, including indicator symbols (in some cases), latency, write protocol, and how one determines whether to encode information or not.

Regarding information encoding decisions, it is relatively straightforward to detect code constraint violations. For example, in the example discussed above where k=30, t=5, m=15, and s=1, if the input data is assumed to be in the NRZ domain, the input data may be passed through a $(1+D^2)$ filter, and the sliding window sum of each interleave may be computed for windows of length m. If either of the two sums is smaller than s, or the combined sum is smaller than t, at any point, then there is a constraint violation and the sector needs to be encoded.

While detection of constraint violations is generally straight-forward, latency in some cases might raise concerns. In the conventional scheme, data is generally written as it arrives. In the present scheme, before one can begin to write (e.g., on the disk or other medium), one generally waits until either a constraint violation is detected or the end of the sector passes through the constraint checker, thereby introducing some latency. There are a few ways to reduce or eliminate this latency, should it be unacceptable or undesirable in a given application.

The simplest approach from a conceptual standpoint is to (i) write uncoded data until the first constraint violation is detected, then (ii) encode data from that point forward. Encoding generally is conducted for the remainder of the frame or sector. This approach also further increases the code rate. In such an approach, one should have a relatively robust encoding scheme for the indicator bits (e.g., that would indicate the location, or at which bit, the written symbols are encoded).

Alternatively, one may divide the sector into a plurality of sub-sectors, then process each sub-sector separately and have the indicator bits indicate which sub-sector(s) are encoded. This method can also be used to encode the sub-sector containing the first violation (plus all subsequent sub-sectors). In such a case, the indicator bits would only have to indicate which sub-sector (if any) is the first encoded sub-sector. Either alternative will reduce, or in the cases where encoding is not needed, eliminate latency.

Reliability may be an issue for indicators in noisy environments. Robust indicator symbols are advantageous in the case where a simple indicator symbol (e.g., a single bit or a short series of bits at a single location) may not be decoded correctly. Assume, for example, that the indicator symbols are inserted right after a synchronization indicator (e.g., a syncmark), and that an event (such as a noise spike or a thermal asperity) wipes out the indicator symbols. As a result, one has no idea what the indicator symbols should be. It is possible in this case to just assume that the data is uncoded, and if the ECC decoder fails to decode the transmitted data, then one assumes that the data is encoded.

Preferably, however, a set of indicator bits is created for each mode or coding state (e.g., coded or uncoded) for a given sector, or in the case that only part of a sector is encoded, coded data beginning at a specific address. Then the indicator bits may be divided into a plurality of (e.g., several) groups, and each group of indicator bits is written in a different place in the sector. Then, if one or two groups of the indicator bits is/are lost, one may have errors in other groups and still decode the data reliably. It is important that the sets of indicator bits not be easily mixed up, or interpreted as indicating a different mode or state, even if a relatively high proportion of indicator bits are lost. In one implementation, data processing to reduce or eliminate latency takes place in the controller, prior to passing the data to the write channel.

Another option is to use different synchronization indicators (e.g., sync marks), depending on the coding state of the sector. This will likely increase the rate, although slightly longer sync marks may be advantageous for other reasons.

Exemplary Software

The present invention also includes algorithms, computer program(s) and/or software, implementable and/or executable in a general purpose computer or workstation equipped with a conventional digital signal processor, configured to perform one or more steps of the method and/or one or more operations of the hardware. Thus, a further aspect of the invention relates to algorithms and/or software that implement the above method(s). For example, the invention may further relate to a computer program, computer-readable medium or waveform containing a set of instructions which, when executed by an appropriate processing device (e.g., a signal processing device, such as a microcontroller, microprocessor or DSP device), is configured to perform the above-described method and/or algorithm.

For example, the computer program may be on any kind of readable medium, and the computer-readable medium may comprise any medium that can be read by a processing device configured to read the medium and execute code stored thereon or therein, such as a floppy disk, CD-ROM, magnetic tape or hard disk drive. Such code may comprise object code, source code and/or binary code.

The waveform is generally configured for transmission through an appropriate medium, such as copper wire, a conventional twisted pair wireline, a conventional network cable, a conventional optical data transmission cable, or even air or a vacuum (e.g., outer space) for wireless signal transmissions. The waveform and/or code for implementing the present method(s) are generally digital, and are generally configured for processing by a conventional digital data processor (e.g., a microprocessor, microcontroller, or logic circuit such as a programmable gate array, programmable logic circuit/device or application-specific [integrated] circuit).

In various embodiments, the computer-readable medium or waveform comprises at least one instruction to (i) add an indicator to the conditionally encoded information; (ii) write a same length of the conditionally encoded information (i.e., write the same length, regardless of whether the information is encoded or unencoded), after the transmitting step(s); and/or (iii) calculate and/or encode error control and/or correction (ECC) code for the information. The indicator may comprise a plurality of indicator bits and may have a first state or value for indicating unencoded information and a second state or value for indicating encoded information. In addition, the indicator may comprise a first plurality of indicator bits at a first location in the conditionally encoded information, and a second plurality of indicator bits at a second location in the conditionally encoded information.

Where the computer-readable medium or waveform includes one or more instructions to calculate and/or encode ECC code, the ECC code may include up to n-k extra units of ECC code, where the unencoded information has a length of k units and the encoded information has a length of n units, as explained above. When the instruction(s) include calculating ECC code (e.g., cyclic redundancy code), the medium or waveform may further include one or more instructions to add such ECC code to the conditionally encoded information to be transmitted. In certain implementations, the computer-readable medium or waveform may further comprise one or more subsets of instructions to (i) write k units of the conditionally encoded information (in this case, regardless of whether the conditionally encoded information is unencoded or encoded) and decode the k units of written conditionally encoded information, and optionally, (ii) at least if decoding the written conditionally encoded information fails, add n-k erasure units to the k units of the written conditionally encoded information and decode the k units of the written conditionally encoded information and the n-k erasure units. Generally, in the first subset of instructions above, either the instruction to decode or both of the write and decode instructions are executed after the conditionally encoded information is transmitted. Optionally, in the second subset of instructions above, one may add the erasure units to the written conditionally encoded information and decode the written conditionally encoded information and the erasure units regardless of whether decoding the written conditionally encoded information alone fails, in which case one simply discards, ignores or does not select (e.g., for subsequent processing) the decoded written conditionally encoded information and erasure units.

In various embodiments, the present computer-readable medium or waveform may be adapted so that the information comprises (i) an indicator and (ii) a data sector, data packet or frame comprising data. Generally, the indicator indicates an encoding status for the information (i.e., whether the information is encoded or unencoded). In one embodiment, the indicator comprises a plurality of groups of indicator bits, spread out over the unit of information (e.g., a block of information being transferred over a channel). Thus, the instructions in the present computer-readable medium or waveform may include an instruction to place the indicator at one or more predetermined locations in the information.

The information may also further comprise a preamble, a synchronization mark, a header sequence, a start-of-frame sequence, a start-of-packet sequence, address information, encryption information, an error checking sequence or an identification sequence. In one embodiment, the computer-readable medium or waveform may include at least one instruction to synchronize a first bit of the block of information to a predetermined reference. The predetermined reference may be a predetermined point in time, a predetermined transition or logic level of a (reference) clock signal, or a first cycle of a counter configured to count the received bits of information.

The set of instructions may also further comprise at least one instruction to (i) compare the indicator to known and/or predetermined values for each of the unique indicators correlated to encoded and unencoded information, respectively; (ii) identify a synchronization mark; and/or (iii) search for a preamble in the received information before the first control sequence section.

Exemplary Circuits and/or Architectures for Conditionally Encoding Information

In one aspect, the present invention relates to a circuit, comprising (a) logic configured to determine whether information complies with one or more constraints; (b) an encoder configured to encode the information; and (c) a selector configured to output (i) the information if the information complies with the constraint(s) and (ii) the encoded information if the information does not comply with the constraint(s). As for the present method(s), the information preferably comprises data, and the data may comprise a data sector, data packet or frame comprising data. Also, as for the present method(s), in various embodiments, the constraint(s) comprise a plurality of constraints, each of which may be selected from a minimum number of transitions per unit of information, a minimum number of transitions per interleave, and/or a maximum number of consecutive same states.

The selector generally provides a means for outputting conditionally encoded information (e.g., either encoded information or unencoded information, depending on whether the uncoded information complies with the coding constraint[s]). Typically, the selector comprises a multiplexer, and/or the encoder comprises a modulation encoder. In various preferred embodiments, the circuit further comprises (i) an error correction and/or control (ECC) encoder configured to add error checking and/or control information to the conditionally encoded information; (ii) a write formatter configured to receive the selector output and/or the ECC encoder output; and/or (iii) one or more padding circuits. The padding circuit(s) may be configured to add a zero pad vector and/or an erasure pad vector to the information, as will be explained in greater detail below with regard to FIG. 7.

Figure 4:
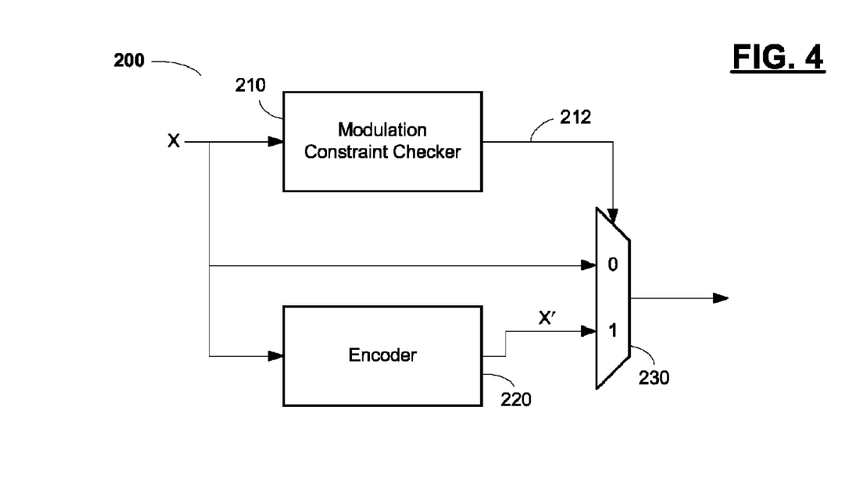
FIG. 4 is a box-level diagram showing an embodiment of the present circuit and/or architecture for conditionally encoding information.

FIG. 4 shows a first exemplary embodiment 200, comprising constraint checker 210, encoder 220 and multiplexer 230. It is well within the abilities of one skilled in the art to design and use logic configured to detect code constraint violations, where the constraint(s) are generally as described above. When the information to be transmitted (e.g., serial data stream X) fulfills coding constraints (e.g., such as those found in conventional modulation codes), constraint checker 210 outputs a digital control signal 212 to multiplexer 230 that selects unencoded information X for transmission. When the information to be transmitted (e.g., X) does not fulfill the coding constraints, constraint checker 210 outputs a complementary digital control signal on bus or node 212 to multiplexer 230 that selects encoded information X' (i.e., the output of encoder 220) for transmission. As described above, encoder 220 preferably comprises a modulation encoder, but it may also comprise a line encoder or a data translation encoder.

Figure 5:
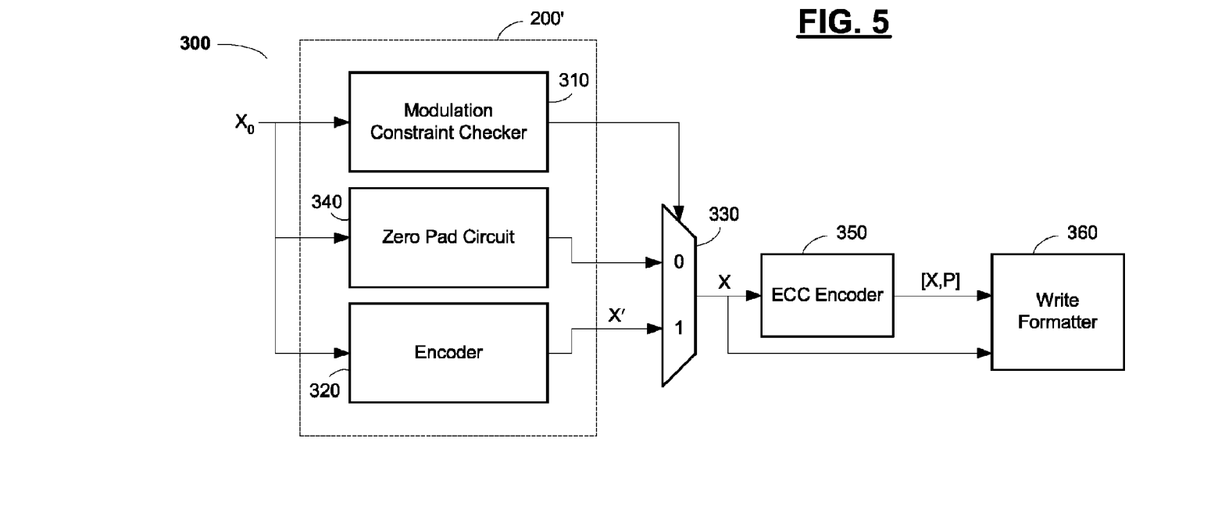
FIG. 5 is a box-level diagram showing an exemplary implementation of conditional modulation coding hardware, further configured for error checking.

FIG. 5 shows an alternative circuit and/or architecture 300 for conditionally encoding information that further includes an error checking and/or control (ECC) function. Circuit 300 generally includes constraint checker 310, encoder 320, multiplexer 330, padding circuit 340, ECC encoder 350 and write formatter 360. (Circuit blocks in different figures that have [i] the same or similar functions and [ii] identification numbers that differ by a multiple of 100 or addition of a prime ['] are generally interchangeable with each other.) FIG. 5 includes essentially the same components as FIG. 4, but further includes (1) padding circuit 340, generally configured to add a zero pad vector to unencoded information (e.g., to serial data stream $X_0$) and (2) error control and/or correction (ECC) circuitry downstream of conditional coding block 200'.

As explained above for the exemplary implementations, when the information comprises a data sector having a length of k bytes and the encoded data has a length of n bytes, padding circuit 340 generally adds a zero pad vector having a length of n-k bytes to unencoded data $X_0$. As a result, regardless of whether unencoded (but zero padded) data or encoded data X' is output from multiplexer 330, conditionally encoded data X of the same length is further encoded by ECC encoder 350 and is written into write formatter 360. ECC encoder 350 and write formatter 360 generally perform their conventional functions (e.g., adding P units [e.g., bytes or bits] of error checking and/or control information such as parity information to conditionally encoded data X, and formatting conditionally encoded, ECC encoded data for subsequent transmission, respectively). In one embodiment, write formatter 360 may also remove the zero pad vector added by padding circuit 340 prior to subsequent transmission.

Exemplary Circuits for Receiving and/or Processing Conditionally Encoded Information In a further embodiment, the invention relates to a circuit for receiving conditionally encoded information, comprising (a) a first decoder configured to decode the information, wherein the information comprises (i) encoded information if the information does not comply with one or more coding constraints and (ii) unencoded information if the information complies with the constraint(s); (b) a detector configured to determine a value of an indicator associated with the information, the indicator having a first value for the unencoded information and a second value for the encoded information; and (c) a first selector configured to output (i) the unencoded information if the indicator has the first value, and (ii) the decoded information if the indicator has the second value. Thus, the circuit for receiving conditionally encoded information generally includes a means for determining a value of an indicator associated with the information, and/or a means for outputting (i) unencoded information if the indicator has a first value, and (ii) the decoded information if the indicator has a second value. (In this context, the terms "value" and "state" are largely interchangeable, and disclosure of one such term may be considered to include the other.)

As for the other aspects of the invention, the information preferably comprises data, and may comprise a data sector, data packet or data frame. Similarly, the constraint(s) preferably comprise a plurality of the constraints, which may comprise a combination of one or more minimum numbers of transitions per unit of information, a minimum number of transitions per interleave (e.g., in each unit of interleaved data in a set of such interleaved data units), and/or one or more maximum numbers of consecutive same states.

Similar to the circuit for conditionally encoding information described above, the first selector may comprise a multiplexer, and the first decoder may comprise a first modulation decoder. However, due to its decoding and/or receiving function(s), the present circuit for receiving conditionally encoded information may further comprise: (1) a processor configured to remove the indicator from the information and/or check the information for errors; (2) one or more padding circuits configured to add a vector to the information; (3) one or more ECC circuits configured to check the information and the vector for errors; and/or (4) a comparator configured to compare the error-checked vector to a predetermined value (which may also be part of the detector). In certain embodiments, the padding circuit(s) and/or the ECC circuit(s) may be part of the detector.

When the circuit includes one or more padding circuits, the vector(s) added by the padding circuit(s) may comprise a zero vector and/or an erasure vector. A zero vector is generally a vector made up of all zero bits, which may have a known or predetermined length, or be configured to form an information block having a known, predetermined or calculatable length. Similarly, an erasure vector is generally a vector made up of all erasure bits, which may have a known or predetermined length, or which may be configured to form an information block having a known, predetermined or calculatable length.

In an embodiment exemplified by zero padding, the first selector may be configured to output (i) unencoded information if the vector has no errors, and (ii) decoded information if the vector has at least one error. Consistent with known zero vector properties and error checking techniques, the vector generally has no errors if its value does not change after error checking, but at least one error if its value changes after error checking. However, this embodiment is not necessarily limited to zero padding, and can encompass other padding vectors that have known values and properties consistent with the function(s) and result(s) of the zero pad circuitry disclosed herein.

Where the circuit includes both zero padding and erasure padding, the circuit may further comprise (i) a second padding circuit configured to add a second vector to the information; and (ii) a second ECC circuit configured to check the information and the second vector for errors. The "second vector" in this case is generally an erasure vector (the first vector being a zero pad vector). The circuit in this embodiment may further comprise (1) a second decoder configured to decode the conditionally encoded information and the erasure vector and/or (2) a second selector configured to output (i) the first selector output if the unencoded information is successfully checked for errors, and (ii) an output of the second decoder information if the unencoded information is not successfully checked for errors. Thus, the circuit may further include a second means for outputting, configured to output (i) the output of the first means for outputting if the unencoded information is successfully checked for errors, and (ii) an output of the second decoder if the unencoded information is not successfully checked for errors. Preferably, the second decoder also comprises a modulation decoder, and the second selector also comprises a multiplexer.

Figure 6:
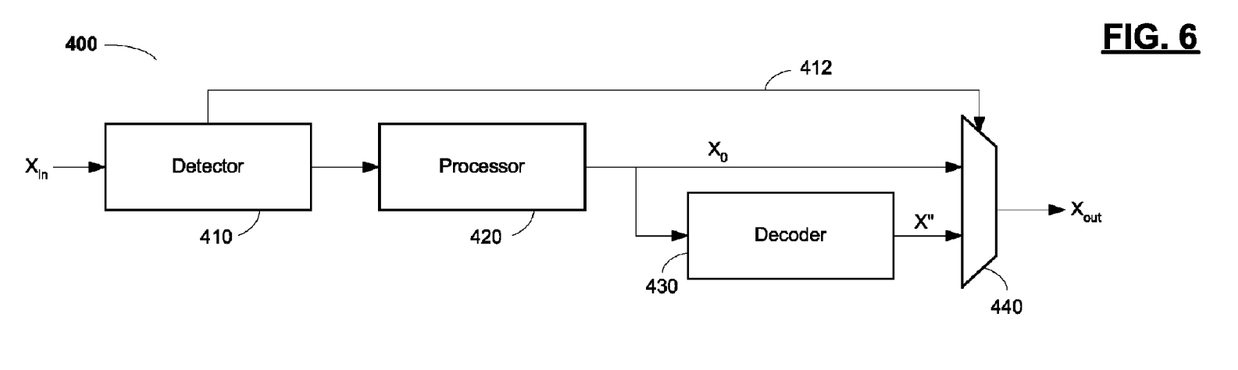
FIG. 6 is a box-level diagram showing an embodiment of the present circuit and/or architecture for processing conditionally encoded information.

The circuitry described in this section is exemplified in FIGS. 6 and 7. FIG. 6 shows a first exemplary embodiment 400, including detector 410, processor 420, decoder 430 and multiplexer 440. Conditionally encoded information that has been transmitted (e.g., serial data stream $X_{in}$) is received by detector 410, which is generally configured to determine whether the conditionally encoded information is encoded or unencoded (e.g., by detecting the indicator and determining its state or value). Similar to the constraint checker in the circuit/architecture of FIGS. 4-5, when the conditionally encoded information $X_{in}$ is not encoded, detector 410 outputs a digital control signal 412 to multiplexer 440 that selects unencoded information $X_0$ for subsequent processing. When the conditionally encoded information $X_{in}$ is encoded, detector 410 outputs a complementary digital control signal on bus or node 412 to multiplexer 430 that selects encoded information X" (i.e., the output of decoder 420) for subsequent processing.

FIG. 7 shows an alternative circuit and/or architecture 500 for processing conditionally encoded information that further includes an error checking and/or control (ECC) code, but that may not include an encoding status indicator. Circuit 500 generally includes padding circuits 510 and 522, ECC decoders 512 and 524 (which are generally the same, but which can be different, depending on design choices and/or application considerations), pad checker 514, pad remover 520, modulation decoders 530a-b, multiplexers 540a-b, and logic gate 550. FIG. 7 includes essentially the same components as FIG. 6, but in greater detail and/or with additional (and in some implementations, somewhat different) functionality. For example, circuit 500 includes (i) a first path 502, generally for determining whether the received information X is encoded or unencoded, for processing unencoded information, and for processing encoded information when the number of errors therein is sufficiently low, and (ii) a second path 504, essentially for processing (truncated) encoded information when the number of errors therein exceeds the system's error correction and/or control capacity.

Both of unencoded information processing path 502 and encoded information processing path 504 receive conditionally encoded information (e.g., serial data stream X). In this embodiment, conditionally encoded information comprises (1) either a full transmission of uncoded data (e.g., as a block or sector) or a truncated transmission of encoded data (see the discussion above with regard to writing the same length of conditionally encoded data into write formatter 360), and (2) error code (e.g., parity data from ECC encoder 350; see FIG. 5). Circuit 500 generally has no problem processing unencoded data, as will be explained below, but the truncated encoded data will result in some error in the receiver. Where the gain from writing the same (shortened) length of data is greater than the loss from truncating encoded data (which will be the case most of the time when most of the transmitted data is not encoded), this scheme is advantageous. Path 504 in circuit 500 addresses the error introduced by the information formatting technique described above with respect to FIG. 5, making the conditional encoding scheme even more advantageous in the case where the amount of data written is that of uncoded data, whether the data has been encoded or not.

Processing path 502 comprises detector block 410', pad remover 520, modulation decoder 530a, and multiplexer 540a. Detector block 410' serves as an indicator of whether the received information is encoded or unencoded, and pad remover 520 is a type of information processor (in that it functions to remove bits or bytes from the information stream). Processing path 504 comprises processor block 420' and modulation decoder 530b. Multiplexer 540b is configured to select one of the outputs of paths 502 and 504 for further processing.

Referring back to processing path 502, detector block 410' comprises pad circuit 510, ECC decoder 512a, and padding vector checker 514. Padding circuit 510 is generally configured to add a zero pad vector to conditionally encoded information X. In the embodiment where the information comprises a data sector having a length of k bytes when unencoded and n bytes when encoded, the zero pad vector generally has a length of n-k bytes. The zero pad vector is added when ECC encoding is performed on zero-padded data (see, e.g., FIG. 5 and the discussion thereof above). Thus, the zero pad vector (or, arguably, the combination of zero pad vector and ECC code) provides an encoding status identifier for conditionally encoded information X, as will be explained below.

Referring back to FIG. 7, ECC decoder 512a is largely conventional, and performs an error checking function on the zero-padded, conditionally encoded information. The zero-padded, ECC decoded information is input in parallel into pad checker 514, zero pad remover 520 and modulation decoder 530a. Pad remover 520 removes information from the data stream at the location(s) corresponding to the added zero pad vector, and modulation decoder 530a decodes the zero-padded, ECC decoded information. Pad checker 514 checks the location(s) corresponding to the added zero pad vector to determine whether its value is still zero after ECC decoding. In the (k,n) data sector embodiment described herein, this location is the last n-k bytes. Logic for such a "zero vector" determining circuit is largely conventional, and its design and implementation is well within the skill level of those skilled in the art.

If the zero pad vector location has a value of zero, pad checker 514 outputs a digital control signal 516 to multiplexer 540a that selects de-padded (unencoded) information 517 for input into multiplexer 540b. If the zero pad vector location has a value of zero, pad checker 514 outputs a complementary digital control signal on bus or node 516 to multiplexer 540a that selects modulation decoded information 518 (i.e., the output of decoder 530a) for input into multiplexer 540b. When the zero pad vector changes value, that indicates that the received data is encoded, and when ECC decoding succeeds on the zero-padded information, the error correcting/ control capacity of the ECC decoder 512 can correct and/or control transmission errors, including those errors introduced by truncating the encoded data.

However, where the error correcting/control capacity of the ECC decoder 512 is not sufficiently large to correct and/or control transmission errors, ECC decoding will fail, and control signal 518a will effectively select the output of processing path 504 for further (downstream) processing. Processing path comprises 504 erasure pad circuit 522, ECC decoder 524, and modulation decoder 530b. Path 504 operates similarly to the "modulation decoder" sub-path in path 502, defined by zero pad circuit 510, ECC decoder 512a, and modulation decoder 530a, except for erasure pad circuit 522, which adds an erasure pad vector to conditionally encoded information X (generally having the same length as the zero pad vector) instead of a zero pad vector. Erasure bits effectively double the error correction and/or control capacity of ECC decoder 524 relative to zero bits, and are easier for error checking circuitry (such as ECC decoder 524) to process.

Note that the ECC decoders 512 and 524 each have two outputs: one output is the error-decoded sector, and the other output is a bit indicating if the decoding succeeded or not. Such a "decoding status" bit can be useful as a control signal for downstream processing (e.g., to acknowledge successful transmission or to request re-transmission of the information, etc.). Thus, ECC control signals 518a-b may be input into logic gate 550 for use elsewhere in the receiver to indicate that the received data could not be successfully ECC decoded. For example, where ECC decoders 512 and/or 524 are replaced with error checking circuitry (e.g., CRC circuitry), the output of logic gate 550 can function as a control signal to activate or deactivate error correction circuitry located elsewhere in the receiver (e.g., downstream from selector 540b). Consequently, although logic gate 550 will typically comprise a conventional OR gate, depending on the application and/or design considerations, it could also be a conventional NOR gate, a conventional NAND gate, a conventional AND gate, etc.

Alternatively, when the encoding status indicator is included in the conditionally encoded information to be transmitted, a detector such as detector 410 (see FIG. 6) can determine the encoding status of the indicator. Referring back to FIG. 7, the output of the detector would then control multiplexer 530b and pad checker 514, modulation decoder 530b, and multiplexer 530a can effectively be eliminated.

The System and Network

Further aspects of the invention relate to transmitters, receivers, transceivers, architectures and systems for transmitting and/or processing conditionally encoded information. The transmitter, for example, comprises the present circuit for conditionally encoding information and a transmission port communicatively coupled to the circuit. The transmission port may be configured to transmit the selector output to a network, a storage device or a communications device.

The present receiver generally comprises the present circuit for receiving conditionally encoded information and a reception port communicatively coupled to the circuit, configured to receive the information. In one embodiment, the receiver further comprises a PLL configured to provide a reference clock signal to the receiver.

A further embodiment relates to a system for transferring information, comprising the present receiver, at least one transmitter configured to process the information for transmission, and a transmission port communicatively coupled to the transmitter and the reception port, the transmission port being configured to transmit the information to the receiver.

The information may be from a storage device (e.g., a disk drive), a communications device or a part of a network, in which case the system may further comprise the storage device, the communications device or the part of the network. Preferably, the information is from a magnetic recording device, such as a disk drive. In further embodiments, the system may be configured to convert (i) serial data from a storage device to parallel data for on-chip processing in the receiver or transceiver, and/or (ii) parallel (on-chip) data in the transmitter/transceiver to serial data for a storage device (which may be the same or different as the storage device from which serial data is received).

Alternatively, the present system may comprise the present transmitter, at least one reception port communicatively coupled to the transmission port for receiving the selector output, and a receiver communicatively coupled to the reception port, configured to process the selector output. In various embodiments, the system may be configured to perform serial-to-parallel and/or parallel-to-serial data conversions (as described above), and/or may further comprise (i) a PLL configured to provide a reference clock signal to the receiver and/or (ii) the storage device, the communications device or at least part of the network.

A further aspect of the invention concerns a network, comprising (a) a plurality of the present systems, communicatively coupled to each other; and (b) a plurality of storage or communications devices, wherein each storage or communications device is communicatively coupled to one of the systems. The network may be any kind of known network, such as a storage network (e.g., RAID array), Ethernet, or wireless network, but preferably, the network comprises a storage network, and the storage network preferably comprises a plurality or matrix of magnetic recording devices.

CONCLUSION/SUMMARY

Thus, the present invention provides a circuit, architecture, system and method for conditional information coding. In one embodiment, the invention relates to conditional modulation codes. The idea is to encode only information blocks (e.g., data sectors) which, when uncoded, do not fulfill modulation constraints. For fairly loose modulation constraints, as many as 9 out of 10 sectors (or more) are not encoded. In some implementations, this yields a performance gain of about 0.5 dB, and also provides density improvements and SNR gain, and may further increase the error correction and/or control capabilities of a system employing conditional information coding. The invention also relates to a number of different variations that utilize the inventive concept in various practical systems. However, the conditional coding scheme(s) described herein are not necessarily limited to modulation codes, and may be applied to other information signal-shaping codes as well, such as line codes and data translation codes.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of processing received information, wherein the received information corresponds to original information, the method comprising:
    determining whether the received information comprises unencoded information or encoded information, wherein the received information comprises unencoded information if the original information fulfills one or more constraints, and wherein the received information comprises encoded information if the original information does not fulfill the one or more constraints; and
    decoding at least the encoded information of the received information in response to the received information comprising encoded information.

2. The method of claim 1, wherein determining whether the received information comprises unencoded information or encoded information comprises:
    identifying an indicator in the received information, wherein the indicator is configured to indicate an encoding status, the indicator having a first state or value for the unencoded information and a second state or value for the encoded information.

3. The method of claim 1, wherein decoding at least the encoded information of the received information comprises modulation decoding.

4. The method of claim 1, further comprising selecting one of the unencoded information and the decoded information as an output for further processing.

5. The method of claim 1, wherein the received information further comprises error correction and/or control code (ECC), and the method further comprises error checking the received information.

6. The method of claim 5, further comprising erasure padding the received information to create erasure padded information, and error checking the erasure padded information.

7. The method of claim 6, further comprising decoding the error checked, erasure padded information.

8. The method of claim 5, further comprising zero padding the received information to create zero padded information.

9. The method of claim 8, wherein the error checking comprises error checking the zero padded information.

10. The method of claim 9, further comprising determining whether the zero padded information comprises a zero pad vector.

11. The method of claim 10, further comprising removing the zero pad vector at least when the zero padded information comprises the zero pad vector.

12. The method of claim 10, further comprising selecting one of the decoded, zero padded information or undecoded information as an error-checked output in response to a result of the determining.

13. The method of claim 9, further comprising the selecting one of the (zero padded) information or decoded information as an output in response to a result of the error-checking.

14. The method of claim 1, wherein the original information comprises data.

15. The method of claim 14, wherein the data comprises a data sector, data packet or data frame.

16. The method of claim 1, wherein the encoded information is encoded with a run-length limited (RLL) code.

17. The method of claim 16, wherein the one or more constraints correspond to run length limits of the RLL code.

18. A computer-readable storage medium comprising a computer-readable set of instructions adapted to:
    determine whether received information comprises unencoded information or encoded information, wherein the received information corresponds to original information, wherein the received information comprises unencoded information if the original information fulfills one or more constraints, and wherein the received information comprises encoded information if the original information does not fulfill the one or more constraints; and
    decoding at least the encoded information of the received information in response to the received information comprising encoded information.

19. A circuit for processing received information, wherein the received information corresponds to original information, the circuit comprising:
    a detector to determine whether the received information comprises unencoded information or encoded information, wherein the received information comprises encoded information if the original information does not comply with one or more constraints, and wherein the received information comprises unencoded information if the original information complies with the one or more constraints; and
    a first decoder to decode the received information at least when the received information comprises encoded information.

20. The circuit of claim 19, wherein the original information comprises a data sector, data packet or data frame.

* * * * *